(12) United States Patent
Tseronis et al.

(10) Patent No.: US 6,508,259 B1
(45) Date of Patent: Jan. 21, 2003

(54) INVERTED PRESSURE VESSEL WITH HORIZONTAL THROUGH LOADING

(75) Inventors: James A. Tseronis, Manchester, NH (US); Heiko D. Mortiz, Milford, NH (US); Mohan Chandra, Merrimack, NH (US); Robert B. Farmer, Billerica, MA (US); Ijaz H. Jafri, Nashua, NH (US); Jonathan Talbott, Amherst, NH (US)

(73) Assignee: S.C. Fluids, Inc., Nashua, NH (US)

( * ) Notice: Subject to any disclaimer, the term of this patent is extended or adjusted under 35 U.S.C. 154(b) by 97 days.

(21) Appl. No.: 09/632,770

(22) Filed: Aug. 4, 2000

Related U.S. Application Data

(60) Provisional application No. 60/147,251, filed on Aug. 5, 1999, and provisional application No. 60/155,454, filed on Sep. 20, 1999.

(51) Int. Cl.$^7$ ................................................. B08B 3/00
(52) U.S. Cl. ...................... 134/105; 134/143; 134/162; 134/200; 134/902; 118/58; 118/64
(58) Field of Search ............................... 134/94.1, 95.3, 134/105, 140, 141, 143, 148, 149, 153, 162, 182, 183, 186, 200, 902; 118/58, 64

(56) References Cited

U.S. PATENT DOCUMENTS

| | | | |
|---|---|---|---|
| 3,744,660 A | 7/1973 | Gaines et al. | 220/582 |
| 4,422,651 A | 12/1983 | Platts | 277/206 R |
| 4,789,077 A | 12/1988 | Noe | 220/319 |
| 4,823,976 A | 4/1989 | White, III et al. | 220/211 |
| 5,071,023 A | 12/1991 | Perrot | 220/315 |
| 5,191,993 A | 3/1993 | Wanger et al. | 220/333 |
| 5,221,019 A | 6/1993 | Pechacek et al. | 220/315 |
| 5,236,669 A | 8/1993 | Simmons et al. | 422/113 |
| 5,251,776 A | 10/1993 | Morgan, Jr. et al. | 220/360 |
| 5,280,693 A | 1/1994 | Huedecker | 53/306 |
| 5,433,334 A | 7/1995 | Reneau | 220/319 |
| 5,554,226 A * | 9/1996 | Okase et al. | 118/715 |
| 5,571,330 A | 11/1996 | Kyogoku | 118/719 |
| 5,589,224 A | 12/1996 | Tepman et al. | 427/248.1 |
| 5,621,982 A | 4/1997 | Yamashita et al. | 34/203 |
| 5,706,319 A | 1/1998 | Holtz | 376/203 |
| 5,746,008 A | 5/1998 | Yamashita et al. | 34/211 |
| 5,900,107 A | 5/1999 | Murphy et al. | 156/359 |
| 5,992,680 A | 11/1999 | Smith | 220/812 |
| 6,029,371 A | 2/2000 | Kamikawa et al. | 34/516 |
| 6,053,348 A | 4/2000 | Morch | 220/263 |
| 6,068,002 A * | 5/2000 | Kamikawa et al. | 134/102.3 |
| 6,085,935 A | 7/2000 | Malchow et al. | 220/813 |
| 6,097,015 A | 8/2000 | McCullough et al. | 219/686 |
| 6,328,560 B1 * | 12/2001 | Fujikawa et al. | 118/725 |

* cited by examiner

Primary Examiner—Randy Gulakowski
Assistant Examiner—Joseph Perrin
(74) Attorney, Agent, or Firm—Maine & Asmus

(57) ABSTRACT

A pressure vessel for use in production processes requiring elevating and ranging of temperatures and pressures during the process cycle, readily adaptable to production line operation, suitable for wafer processing in the semiconductor industry and for other industries and processes. The pressure vessel is configured within an open support frame with a stationary, preferably inverted, orientation. The cover or closing plate is vertically movable towards the mouth of the pressure vessel and functions as the platform by which the object under process is transferred into the vessel. The moving and locking mechanism for the cover is isolated and shielded from the process environment.

13 Claims, 5 Drawing Sheets

INVERTED PRESSURE VESSEL WITH HORIZONTAL THROUGH LOADING

This application relates and claims priority to U.S. applications Ser. No. 60/147,251 filed Aug. 5, 1999, and Ser. No. 60/155,454 filed Sep. 20, 1999.

BACKGROUND OF THE INVENTION

1. Technical Field of the Invention

This invention relates to pressure vessels used in process operations requiring extreme cleanliness and operated at elevated pressures and temperatures, and in particular to pressure vessel design and closure mechanisms that facilitate easier and cleaner loading and closing of pressure vessels used in automated wafer treatment processes in a production environment.

2. Background Art

There is a general requirement in the semiconductor industry, and in other industries as well, for conducting processes that require enclosures or pressure vessels that can be loaded with wafers or other objects to be processed, permit the admittance and removal of process fluids or materials necessary to the process after the enclosure is sealed, and be elevated and ranged in pressure and temperature to, in some cases, extremes. Some processes are much more critical as to contamination, and require quick and close control of temperature, pressure, and the volume and timing of the introduction of process fluids to the pressure vessel. Add to that the demand for conducting these processes in a production mode, and the growing sophistication of the processes themselves, and it is amply clear that improvements in pressure vessels are needed.

This disclosure relates in particular to pressure vessels used in operations requiring extreme cleanliness and operated at elevated or high pressures up but not limited to 10,000 psi (pounds per square inch), and further, to pressure vessel design and isolated lid locking mechanisms that facilitate easier loading and locking of pressure vessels used in automated wafer treatment processes in a production environment. By way of example of the typical requirements placed on a pressure vessel, one process is described below.

This example refers to the manufacture of MEMS (Micro Electro Mechanical Systems) devices where the process agent is carbon dioxide in liquid and supercritical form. Other semiconductor related applications with strict cleanliness requirements, such as photoresist stripping, wafer cleaning, particulate removal, dry resist developing, and material deposition, all suffer from the same pressure vessel deficiencies, which include particle generation upon closing, closure mechanisms that are not suited for, quick closing, problems with automatically loading and unloading the vessel, and problems with the integration of the apparatus in a production line.

One method of manufacturing Microetectromechanical systems (MEMS) based devices is Sacrificial Surface Micromachining (SSM) or Surface Micromachining. In a simple "anchored" SSM silicon based production process, there is deposited on a substrate such as Silicon, a sacrificial layer of material such as grown $SiO_2$, silicon dioxide, or some type of photoresist material in the case of processes for stripping photoresist. The sacrificial material is etched to open a hole for the anchor of the structure. A structural material such as polysilicon, or metal, is then deposited on the sacrificial material. Finally, the sacrificial material is etched away to release the structural layer, creating the microstructure. These steps can be repeated to form more complex multi-level structures.

After the removal of a sacrificial layer the substrate is rinsed. Upon evaporation of the rinsing liquid that is trapped between the "released" structure and the substrate surface a capillary force is generated that pulls down the released structure until it touches the substrate surface. The surface tension of the rinsing liquid generates the capillary force upon evaporation due to liquid/vapor phase transition. Stiction or adhesion occurs when the released structure adheres to the other surface, as for example in the case where a polysilicon or metal cantilevered beam adheres to the substrate, resulting in a defect in the device.

In a laboratory method, originally developed by researchers of the University of California at Berkeley, a silicon wafer containing a pattern of microelectromechanical structures, having been fabricated in the conventional manner, is arranged in a pressure vessel, submerged in methanol. The pressure vessel is first filled with methanol, and the wafer quickly transferred into the vessel, being maintained underneath a liquid layer of the methanol during the transport and loading process. The vessel is sealed, and a through-flow of liquid carbon dioxide introduced for about 15 minutes, during which time the methanol is rapidly absorbed into the liquid carbon dioxide and carried out of the pressure vessel.

When the vessel cavity has been entirely purged of methanol and is completely filled with pure liquid carbon dioxide, heat is applied uniformly for several minutes, causing the carbon dioxide to transition to its supercritical phase at a temperature higher than 31.1 degrees centigrade and a pressure of higher than 1073 psi, in which it has no surface tension. For drying the microstructured substrate the vessel cavity is vented from the supercritical state to atmosphere pressure while keeping the temperature higher than the critical temperature of the carbon dioxide. A phase transition does not occur, hence a capillary force is not generated and stiction is avoided completely. It is at this point that the benefit of the process is realized, as no liquid/vapor interface occurs during this transition to cause unwanted surface tension.

Other processes like photoresist stripping or wafer cleaning in general, which use a process agent in gaseous, liquid and supercritical form, are similar to the MEMS drying process in so far as they also apply the process agent to the vessel in a similar way and are finalized by the drying step. The MEMS process therefore is considered as exemplary for all applications with gaseous, liquid, and supercritical process agents where extreme cleanliness and high throughput are basic requirements.

There are several obvious problems with the laboratory set up that must be addressed in order to make the process sufficiently cost-effective and efficient for use in a production environment. The device is not suitable for integration into a production line with automated means for inserting and removing wafers; there is no safe transfer mechanism to ensure that a liquid layer is maintained on the wafer during the transport or transfer process; the closing mechanism is manual and too slow; and the serially administered steps of the process are manually accomplished and too slow. The device is also lacking the safeguards required by industrial standards and regulations for production requirements.

In the production setups used currently, the pressure vessel is loaded by vertical placement through an open top port of the same or larger diameter of the wafers being processed, and is unloaded by reverse action. The vessel is typically closed by manually bolting or mechanically clamping the process vessel flanges and its cover flanges together around the perimeter to form a pressure seal. This apparatus and methodology is both slow and prone to introducing particulate contamination due to the mechanical interface and constant wearing of mating surfaces. The particulate is generated immediately within the loading and processing environment, and inevitably contaminates the materials being processed to some degree.

These contaminants are of particular concern in the semiconductor industry, as even trace amounts are sufficient to plague product quality and production efficiencies. When these perimeter flange latching mechanisms are semi-automated for faster closure or production purposes, the contamination problem is simply placed in a free-running mode that gets progressively worse if unattended.

There are many examples in prior art. One such example is an autoclave, quick opening door assembly as shown in prior art FIG. 1. It consists of a chamber flange, a rotating locking ring and the door flange. The door and vessel are clamped. and unclamped by the rotation of the locking ring only. As the ring rotates, surfaces of the mating wedges force the chamber flange tight against the gasket providing a leak proof static seal. Due to the contact of the wedges sliding across each other, particles are generated that eventually contaminate the process beyond acceptable tolerances.

A further problem with traditional pressure vessels in a production environment is the difficulty in adapting them to the standard wafer handling robots of the semiconductor industry. Complex carriage systems are often necessary for automation of the loading and extracting of materials being processed, involving complex transitions between horizontal and vertical transport of the wafers between processing stations.

SUMMARY OF THE INVENTION

The invention is fundamentally a pressure vessel system for conducting industrial processes, suitable for applications where extremes of cleanliness, temperature, and pressure are encountered, and adaptation to automated production systems is important. In its simplest form, it is a stationary pressure vessel with connections or ports through which process materials or ingredients are delivered and removed, in combination with a vertically movable lid or cover. These two components are attached directly or indirectly to a common open framework for support. The closing and locking mechanisms are remote from the process environment of the pressure vessel and the space between the open cover and the pressure vessel. The apparatus is adaptable to processes requiring pressures up to the 5,000–10,000 psi (pounds per square inch) pressure range and beyond by proper design. Temperature of the contents can be ranged as the process requires, when configured with suitable internal and or external heating sources.

The apparatus is adaptable to a horizontal, pass-through conveyor system, any standard wafer handling robot systems, or any other handling system for delivering and loading articles to be processed under pressure, onto the cover. The vertically operated cover can carry a wafer cassette, a single wafer, or other object being processed into the pressure vessel for processing, and out again for pickup and further transport. A lift and lock mechanism for operating the cover is fully contained on the backside or outside of the cover, and shielded so as to isolate any particulate generated by the lift and lock mechanism from the loading and processing environment.

It is an object of the invention to provide a pressure vessel system with less risk of contamination from closing and locking mechanisms.

Is a further object to provide a pressure vessel system readily adaptable to horizontally oriented wafer transfer or handling systems, where the vertical component of placement within the pressure vessel is accomplished or supported by the pressure vessel and lid closing system.

The invention extends to a system consisting of an open support frame, an inverted pressure vessel, a vertically movable underside cover, and a lift and lock mechanism, where the cover is movable by the lift and lock mechanism between a lower open position and an upper closed and locked position against the mouth of the inverted pressure vessel, and where the open support frame is configured with spaced apart uprights that permit bi-directional horizontal access to the top side of the cover when in the open position, and where the lift and lock mechanism is located below the cover and is mechanically shielded from direct exposure to the top side of the cover and the interior of the pressure vessel.

It is a further object of the invention to provide a pressure vessel system where the lift and lock mechanism has horizontal linear sliding blocks for locking the cover up tight against the mouth of the inverted pressure vessel.

It is a yet further object to provide a pressure vessel system where the lift and lock mechanism has a rotating lug lock system for locking the cover up tight against the mouth of the inverted pressure vessel.

Still other objectives and advantages of the present invention will become readily apparent to those skilled in this art from the detailed description, wherein we have shown and described a preferred embodiment of the invention, simply by way of illustration of the best mode contemplated by us on carrying out our invention.

DESCRIPTION OF THE PREFERRED EMBODIMENT

The invention is susceptible to many variations. Accordingly, the drawings and following description of the preferred embodiment are disclosed as illustrative of the invention, and are not to be construed as restrictive.

The preferred embodiment is intended for use in the semiconductor industry for photoresist stripping, particle removal, dry resist develop, cleaning of wafers, drying of MEMS structures, and other applications not explicitly mentioned here, that use process agents in a high-pressure process with the process agent in gaseous, liquid, or supercritical phase, with or without possible modifiers. These processes typically require a high degree of cleanliness, and must be adaptable to automated loading and unloading so as to facilitate high production rates.

Figure 1:
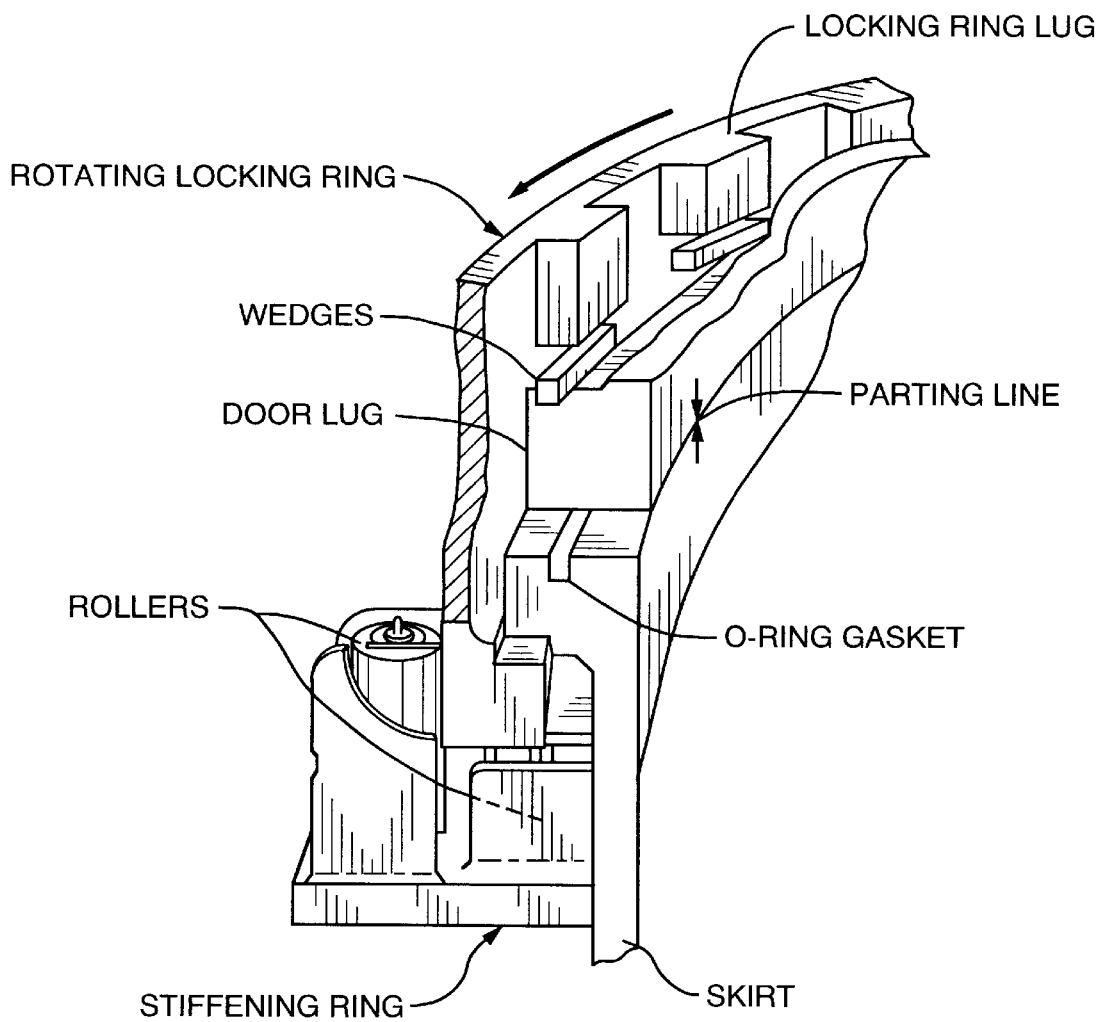
FIG. 1 is a cut away perspective view of a prior art autoclave quick opening door mechanism.
Figure 2:
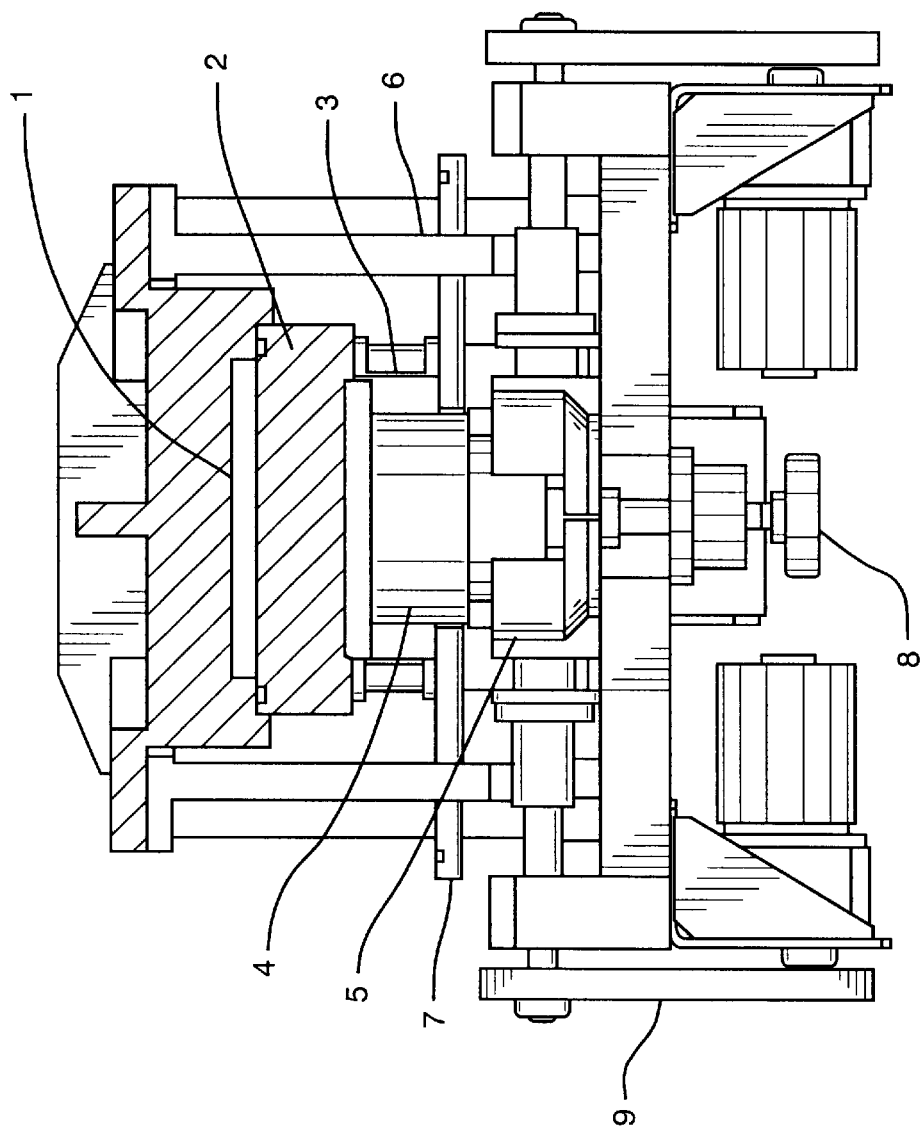
FIG. 2 is a side elevation of a preferred embodiment inverted pressure vessel of the invention with linear slide lock blocks, with the vessel closed.
Figure 3:
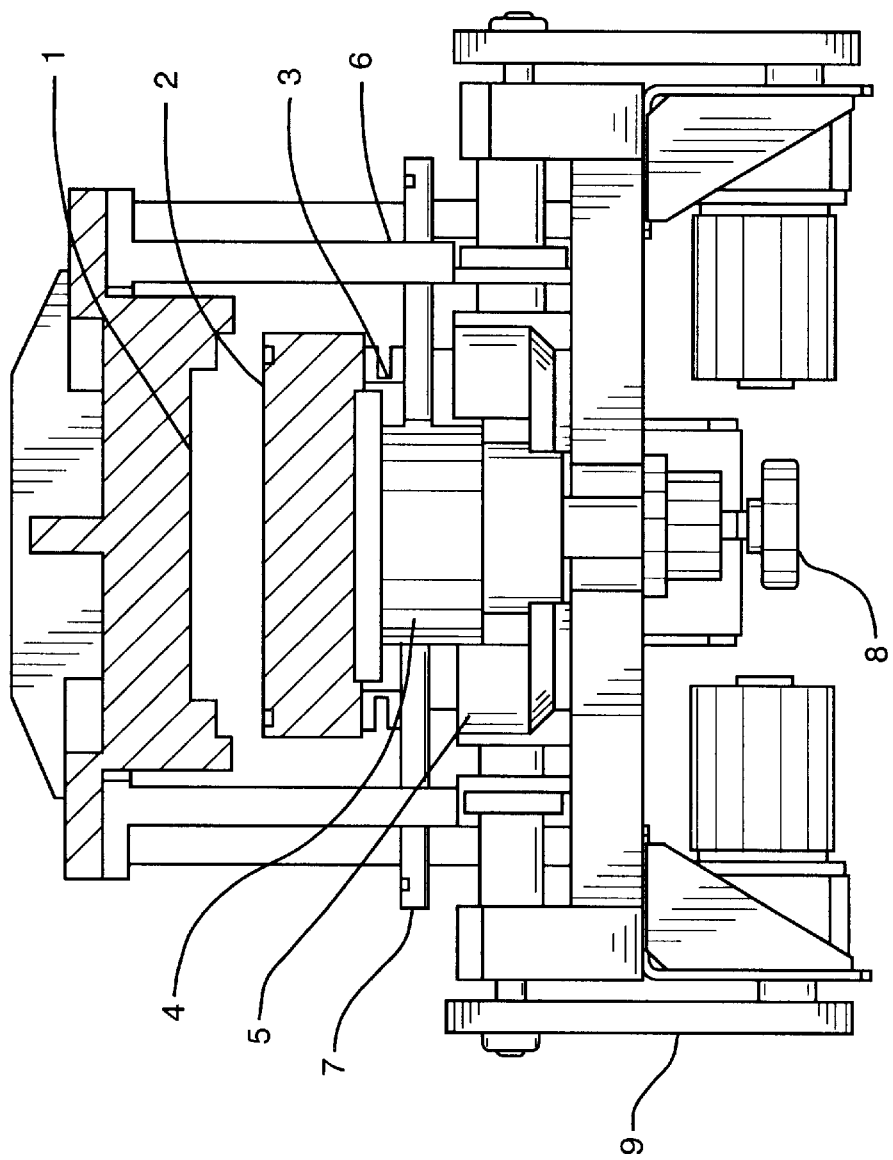
FIG. 3 is a side elevation of the embodiment of FIG. 2 with the vessel open.

Referring to FIGS. 2 and 3, a first preferred embodiment utilizes an inverted pressure vessel 1 rigidly mounted at the upper end of a stationary assemble support frame 6. Not shown are the channels and ports for admitting and removing process fluids from the vessel, and such heaters, internal or external, as may be required for achieving process temperature requirements.

Vertically movable vessel closing plate 2 can be alternately described as a vertically removable bottom plate, and functions as an open sided base or platform upon which a wafer, wafer cassette, or other object being processed, is placed, whether by manual or automated means such as a conveyor system or wafer handling robot. Closing plate 2 functions as the lifting platform by which the object being processed is lifted into pressure vessel 1. The vertical members of support frame 6, bridge the region around vessel 1 and closing plate 2 such that there is room to accommodate the manual handling or horizontal wafer pass-through conveyor system or robot that delivers and removes wafers off the open closing plate. Vessel closing plate 2 may or may not be configured with additional channels, ports and heaters as may be suitable to the particular process for which the apparatus is intended.

In this embodiment, closing plate 2 is supported and vertically moved between open and closed positions by an axial lift rod 4. A lower end lift rod drive 8 powers the lift rod and closing plate 2 up and down between open and closed positions.

Opposing linear slide lock blocks 5 are powered by respective lock block drives 9 for horizontal movement between unlocked and locked positions beneath the closed closing plate 2. When lock blocks 5 are in the unlocked position or spaced apart position as in FIG. 3, there is clearance for vertical movement of lift rod 4 and closing plate 2 between open and closed positions. When closing plate 2 is in the closed position with respect to vessel 1, lock blocks 5 can be moved together into the locking position as in FIG. 2, which seals and locks closing plate 2 to vessel 1 such that process pressure can be attained and maintained for the necessary duration.

The components that provide vertical motion to closing plate 2 are all contained below and within isolation plate 7 and circular telescoping bellows 3, so as to isolate the lift and lock mechanisms and related usual sources of contamination from the process environment by a combination of gravity and physical shielding.

Figure 4:
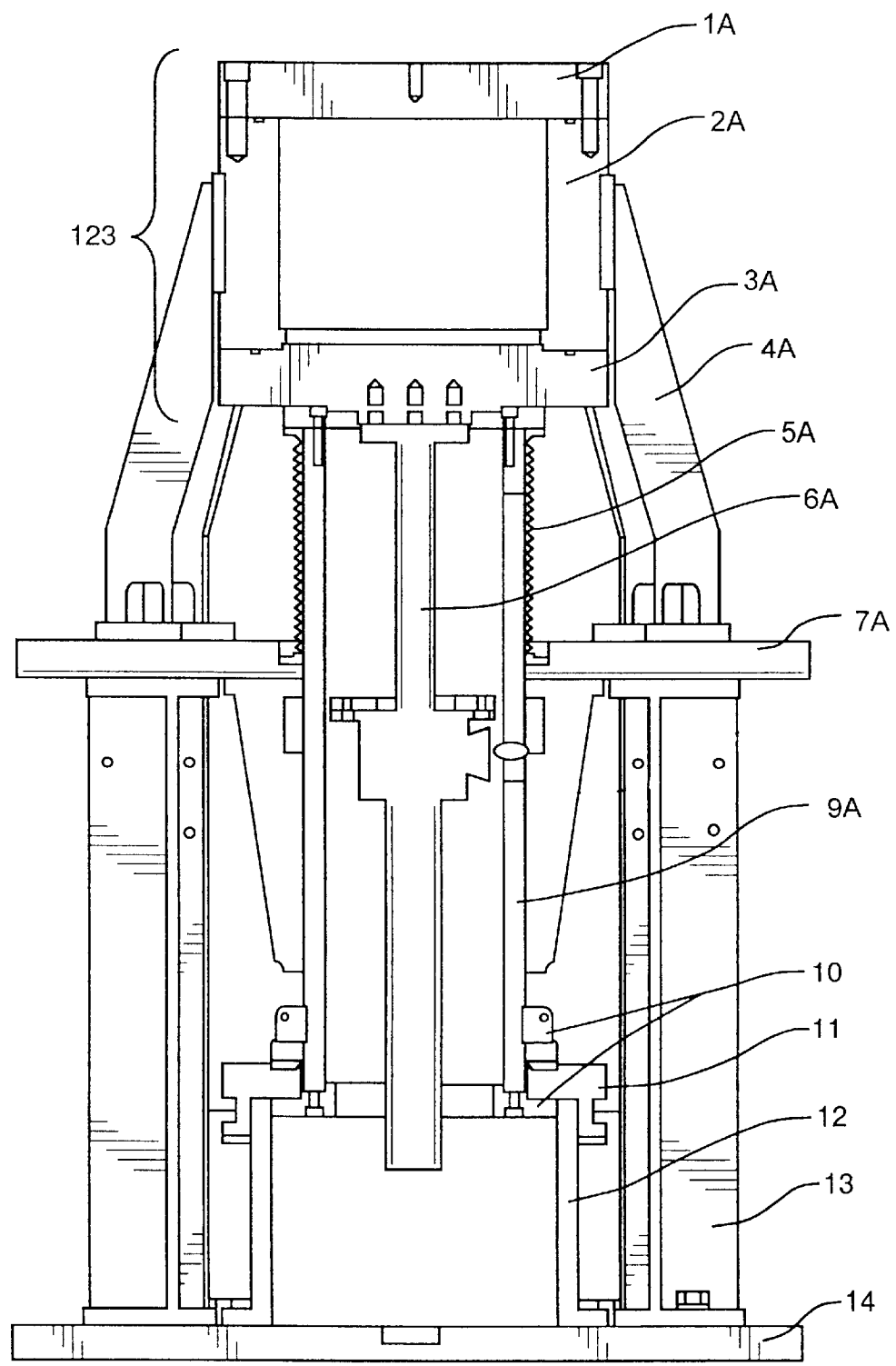
FIG. 4 is a side elevation/cross section view of an alternate embodiment of FIG. 2 with a rotating lock plate.
Figure 5:
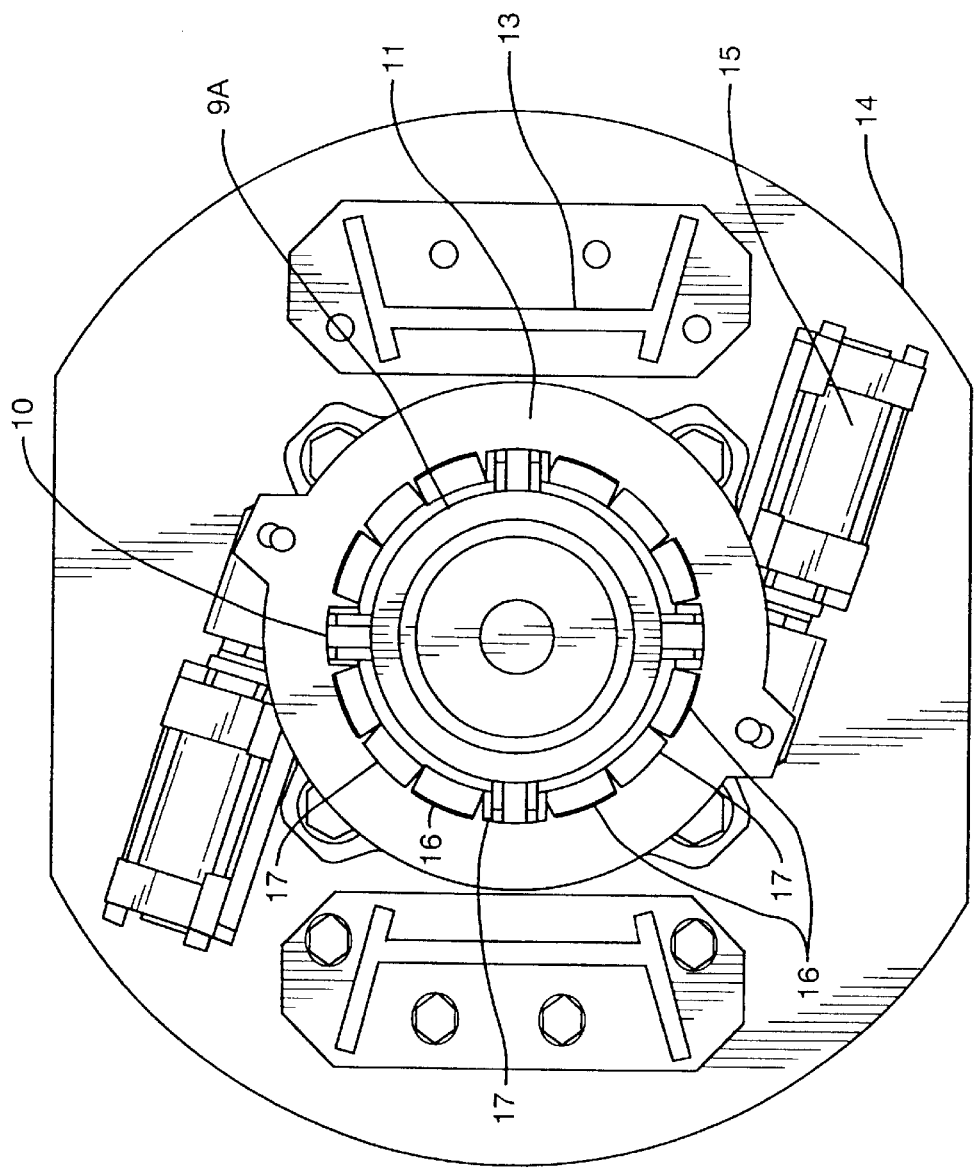
FIG. 5 is a section view of the rotating lock plate of the embodiment of FIG. 4.

Referring to FIGS. 4 and 5 an alternate embodiment of the invention has an inverted pressure vessel consisting of a pressure vessel top 1A, secured to cylindrical wall section 2A but removable for servicing the pressure chamber, connections, and internal components. The inverted pressure vessel is supported by support members 4A mounted on upper base plate 7A. A vertically moveable underside closing plate 3A is operated by lift mechanism 6A, which is enclosed by isolation bellows 5A. This aides in preventing contamination of the process environment with debris generated in the lift mechanism. Pressure vessel top 1A, wall section 2A, and closing plate 3A, collectively form pressure vessel 123.

It is within the scope of the invention that the sealing interface between the lower end of wall section 2A and the perimeter of closing plate 3A can be of numerous and various designs, and may incorporate a suitable seal or seals between sliding surfaces or between opposing face surfaces.

The channels and ports for admitting and removing process fluids from the pressure vessel are not shown in the figures as the illustration is for the general case. However, the mechanical implications of particular process requirements, including necessary pressure and temperature ranges, and delivery and removal of fluids or other ingredients of the process to the pressure vessel, will be readily apparent to the practitioners of particular processes for which the system is intended. For example, such heaters as may be required for achieving process temperatures and temperature changes may at the design stage or later be incorporated internally, or be arranged externally to the pressure vessel.

In a variation of the above embodiment, the closing plate can be the stationary component and the inverted pressure vessel be the vertically movable component by an isolated overhead mechanism analogous to the shielded lift mechanism described above. There are considerations such as the need for flexible process connections to the pressure vessel that make this approach more difficult to execute and operate, but it retains the benefit of a shielded lift and lock mechanism, and avoids having the robot or conveyor system having to supply the vertical component of insertion and removal of the wafer into the pressure chamber.

In an alternate embodiment, the basic structure of the invention; the open support framework, shielded or isolated closing plate lift mechanism, movable closing plate, and stationary pressure vessel, can be designed, constructed and operated in an inverted manner, with the stationary pressure vessel having a topside opening and the shielded lift mechanism and vertically movable closing plate being on top. While the gravity assisted benefit of placement of a wafer or wafer cassette on the closing plate will not be present, the benefit of reduced probability of contamination from the isolated closing plate lifting (or in this case, lowering) mechanism will still be present. In this case, a simple suspension system for the wafer or wafer cassette may be incorporated into or attached to the interior surface of the closing plate, suitable for either manual or automated placement and removal of the wafers being processed.

In a variation of the above alternate embodiment, the closing plate can be the stationary component and the pressure vessel can be vertically moveable. Again, a vertically movable pressure vessel creates special requirements such as flexible process connections to the pressure vessel, that make this approach more problematic than a stationary pressure vessel. But it retains the benefit of a shielded lift and lock mechanism, and avoids having the robot or conveyor system having to supply the vertical component of insertion and removal of the wafer into the pressure chamber.

Referring again to FIGS. 4 and 5, the pressure vessel system incorporates a rotate-to-actuate lock plate, instead of the linear slide blocks of FIGS. 2 and 3, explained in more detail below. The top base plate 7A and isolation bellows 5A are analogous to isolation plate 7 and bellows barrier 3 of FIGS. 2 and 3, with respect to isolating or shielding the vertical lift and lock mechanism from the process environment. The open framework of the pressure vessel support member 4A, likewise accommodate a horizontal wafer pass-through conveyor system or robotic placement and removal of wafers, as in the embodiment of FIGS. 2 and 3.

Upper base plate 7A is supported by lower support members 13, which are attached to lower base plate 14. Locking rod 9A is a cylindrical member securely attached to closing plate 3A and extending vertically down through lock plate 11 and lock plate support 12. Lift mechanism 6A is enclosed within locking rod 9A and is operable to lift and lower closing plate 3A to and from sealing closure with the lower end of wall section 2. The lift mechanism may be hydraulic, threaded screw, or any other manner of jacking or extension mechanisms sufficiently robust to achieve tie required closing pressure.

Locking rod clamp plate 10 is firmly secured to the lower end of locking rod 9A in a non-rotational manner. The perimeter flange or outer edge of clamp plate 10 is configured with uniformly spaced locking lugs 17. A corresponding rotate-to-actuate lock plate 11 is conversely configured with internally directed, uniformly spaced, locking lugs 16. Lock plate 11 is rotable through a limited are between a first unlocked position and a second locked position on locking plate support 12 by actuators 15. The center opening in lock plate 11 is sized to permit clamp plate 10 and its lugs 17 to pass vertically through lock plate 11 when their relative rotational positions place lugs 16 and 17 in alternating positions.

After lift mechanism 6A has elevated closing plate 3A into sealing contact with wall section 2A so as to complete the closure of pressure vessel 123, actuators 15 can be activated to rotate lock plate 11 so as to advance its lugs 16 squarely beneath corresponding lugs 17 of clamp plate 10, thus providing a mechanical lock to the closure of pressure vessel 123 during the process cycle. Other mechanical locking mechanisms, presently known or as may be conceived, are within the scope of the invention. For example, the slide lock blocks of the embodiment of FIGS. 2 and 3 may be adapted to the general design of FIGS. 4 and 5.

The invention, including the embodiments and examples described and illustrated herein, and others that will be readily apparent as being within the scope of the invention and the claims that follow to those skilled in the art, has many advantages over the prior art. In particular, there is the use of the cover or closing plate as the platform by which the wafer is vertically transferred into the vessel, whether from below or above. There is also the use of the open or circumstantial support frame which provides the opposing reference surfaces for exerting the clamping pressure that holds the pressure vessel and closing plate together, which enables isolation and shielding of the lift and lock mechanism for reduced contamination of the process environment, and facilitates the use of a pass-through conveyor system or robotic loading of the pressure vessel in a production mode. In addition, the preferred embodiments illustrate a horizontally sliding mechanism and a rotating lock mechanism, each of which require a relatively simple drive motion to execute.

As will be realized, the invention is capable of other and different embodiments and its several details are capable of modifications in various obvious respects, all without departing from the essence of the invention.

For example, there is within the scope of the invention, a pressure vessel system for conducting industrial processes consisting of an open support frame, an inverted pressure vessel affixed to the open support frame, a vertically movable underside cover, and a mechanism for moving the cover between an upper closed position against the inverted pressure vessel and a lower open position below the pressure vessel, where the interior of the pressure vessel and the space between the cover when its open and the ,pressure vessel is considered to be the process environment where delivery and removal of the objects under process occurs, as well as actual processing.

As a further example, embodiments of the invention may include a relatively independent mechanical locking system located remote of or away from the process environment, where the locking system is operable between a locked position and an unlocked position when the cover is in the closed position. In the locked position, the cover is mechanically constrained so that it cannot be opened accidentally by process pressure up to the structures design limit or by operator error or cover moving system malfunction. The purpose of the locking system is in part to satisfy typical government safety requirements common to pressure vessels used in industry.

As a yet further example, embodiments of the invention may be adapted or adaptable for use with a robotic object handling system or a conveyor system of any sort for delivering objects such as semiconductor wafers or wafer cassettes to the pressure vessel system for processing in the pressure vessel. The optimal adaptation with respect to the capabilities of the invention, would employ the pressure vessel system to supply or support some or all of the vertical component of movement needed to insert the object under process into the pressure vessel.

As another example, embodiments of the invention may employ locking systems using opposing horizontal sliding blocks and actuators, where the sliding blocks are slidable between locked and unlocked positions.

As yet another example, embodiments of the invention may employ a locking system consisting of a locking rod or cylinder extending vertically below the cover, and a non-rotable locking rod clamp plate attached to the lower end of the locking rod, where the clamp plate has externally directed holding lugs uniformly spaced about its perimeter. A horizontally oriented and rotable locking plate is rotatingly attached with suitable support to the open support frame below the cover. The locking plate has a center opening and centrally directly locking lugs uniformly spaced about the center opening. When the locking plate is in the unlocked position rotationally, the locking lugs and the holding lugs are misaligned so as to provide clearance for vertical travel of the clamp plate through the locking plate. The center opening in the locking plate then allows the clamp plate and locking rod to pass up through the locking plate when the cover is moved to the closed position. The locking plate has actuators for causing partial rotation so that the locking lugs are aligned beneath the holding lugs, thus mechanically locking the cover in closed position.

Other and various embodiments of the invention will be apparent to those skilled in the art, upon full consideration of the description, figures, and claims that follow.

We claim:

1. A pressure vessel system for conducting industrial processes comprising an open support frame, an inverted pressure vessel affixed to said open support frame, a vertically movable underside cover, means for moving said cover between an upper closed position against said inverted pressure vessel and a lower open position below said pressure vessel, the interior of said pressure vessel and the space between said cover when in said lower open position and said inverted pressure vessel comprising a process environment, a mechanical locking system operable between a locked position and an unlocked position when said cover is in said upper closed position, the position of said cover being mechanically constrained to said upper closed position when said locking system is in said locked position, a shield isolating said process environment from said means for moving said cover and said locking system, and means for applying heat to said pressure vessel.

2. The pressure vessel system of claim 1, further comprising means for applying and relieving pressure in said pressure vessel when sealed.

3. The pressure vessel system of claim 2, further comprising means for inserting and removing process ingredients from said pressure vessel when sealed.

4. The pressure vessel system of claim 3, further comprising a robotic object handling system for delivering objects to said system for processing in said pressure vessel.

5. The pressure vessel system of claim 3, further comprising a conveyor system for delivering objects to said system for processing in said pressure vessel.

6. The pressure vessel system of claim 1, said locking system comprising opposing horizontal sliding blocks and actuators, said sliding blocks being slidable between a said locked position and a said unlocked position.

7. The pressure vessel system of claim 1, said locking system comprising a locking rod extending vertically below said cover, a non-rotable locking rod clamp plate attached to the lower end of said locking rod, said clamp plate having externally directed holding lugs uniformly spaced about its perimeter, a horizontally oriented and rotable locking plate rotatingly attached to said open support frame below said cover, said locking plate having a center opening and centrally directly locking lugs uniformly spaced about said center opening, said clamp plate passing up through said locking plate when said cover is moved to said closed position, said locking plate having actuators for causing partial rotation of said locking plate between a said locked position wherein said locking lugs are aligned beneath said holding lugs and a said unlocked position wherein said locking lugs are misaligned with said holding lugs.

8. A pressure vessel system for processing of semiconductor wafers in a supercritical fluid environment, comprising, an open support frame, an inverted pressure vessel affixed to said open support frame, a vertically movable underside cover, means for moving said cover between an upper closed position against said inverted pressure vessel and a lower open position below said pressure vessel, the interior of said pressure vessel and the space between said cover when in said lower open position and said inverted pressure vessel comprising a process environment, a mechanical locking system operable between a locked position and an unlocked position when said cover is in said upper closed position, the position of said cover being mechanically constrained to said upper closed position when said locking system is in said locked position, a shield isolating said process environment from said means for moving said cover and said locking system, means for applying heat to said pressure vessel, means for inserting and removing process ingredients under pressure into and from said pressure vessel when sealed.

9. The pressure vessel system of claim 8, further comprising a robotic object handling system for delivering objects lo said system for processing in said pressure vessel.

10. The pressure vessel system of claim 8, further comprising a conveyor system for delivering objects to said system for processing in said pressure vessel.

11. The pressure vessel system of claim 8, said locking system comprising opposing horizontal sliding blocks and actuators, said sliding blocks being slidable between a said locked position and a said unlocked position.

12. The pressure vessel system of claim 8, said locking system comprising a locking rod extending vertically below said cover, a non-rotable locking rod clamp plate attached to the lower end of said locking rod, said clamp plate having externally directed holding lugs uniformly spaced about its perimeter, a horizontally oriented and rotable locking plate rotatingly attached to said open support frame below said cover, said locking plate having a center opening and centrally directly locking lugs uniformly spaced about said center opening, said clamp plate passing up through said locking plate when said cover is moved to said closed position, said locking plate having actuators for causing partial rotation of locking plate between a said locked position wherein said locking lugs are aligned beneath said holding lugs and a said unlocked position wherein said locking lugs are misaligned with said holding lugs.

13. The pressure vessel system of claim 8, said means for applying heat comprising heaters within said pressure vessel connectable to an external power source.

* * * * *

UNITED STATES PATENT AND TRADEMARK OFFICE
CERTIFICATE OF CORRECTION

PATENT NO. : 6,508,259 B1
DATED : January 21, 2003
INVENTOR(S) : James A. Tseronis et al.

It is certified that error appears in the above-identified patent and that said Letters Patent is hereby corrected as shown below:

Title page,
Item [56], References Cited, U.S. PATENT DOCUMENTS, insert:
-- 3,968,885 A 07/1976 HASSAN et al. .............................. 214/1BC --
-- 4,355,937 A 10/1982 MACK et al. ................................ 414/217 --
-- 4,522,788 A 09/1985 SITEK et al. ............................ ...... 422/78 --
-- 4,626,509 A 12/1986 LYMAN .................................... 435/287 --
-- 4,827,867 A 05/1989 TAKEI et al. ........................... ..... 118/64 --
-- 4,879,431 A 11/1989 BERTONICINI ............................ 435/311 --
-- 5,071,485 A 12/1991 MATTHEWS et al. ......................... 134/2 --
-- 5,169,408 A 08/1992 BIGGERSTAFF et al. ................. ..... 29/25.01 --
-- 5,224,504 A 07/1993 THOMPSON et al. ................... ...... 134/155 --
-- 5,314,574 A 05/1994 TAKAHASHI ............................ 156/646 --
-- 5,989,342 A 11/1999 IKEDA et al. ............................... 118/52 --
FOREIGN PATENT DOCUMENTS, insert -- JP 1-246835 10/1989 --
OTHER PUBLICATIONS, insert:
-- PCT International Search Report dated May 31, 2001 of International Application No. PCT/US00/03796 filed February 5, 2001 --

Signed and Sealed this

Twentieth Day of July, 2004

JON W. DUDAS
*Acting Director of the United States Patent and Trademark Office*